(12) United States Patent
Cunningham

(10) Patent No.: US 6,455,937 B1
(45) Date of Patent: Sep. 24, 2002

(54) ARRANGEMENT AND METHOD FOR IMPROVED DOWNWARD SCALING OF HIGHER CONDUCTIVITY METAL-BASED INTERCONNECTS

(76) Inventor: James A. Cunningham, 19771 Junipero Way, Saratoga, CA (US) 95070

( * ) Notice: Subject to any disclaimer, the term of this patent is extended or adjusted under 35 U.S.C. 154(b) by 0 days.

(21) Appl. No.: 09/271,179

(22) Filed: Mar. 17, 1999

Related U.S. Application Data

(63) Continuation-in-part of application No. 09/148,096, filed on Sep. 4, 1998, which is a continuation-in-part of application No. 09/045,610, filed on Mar. 20, 1998.

(51) Int. Cl.$^7$ .......................... H01L 23/48; H01L 23/52; H01L 29/40
(52) U.S. Cl. ........................ 257/762; 257/763
(58) Field of Search ................ 257/762, 760, 257/767, 751, 763

(56) References Cited

U.S. PATENT DOCUMENTS

| | | | |
|---|---|---|---|
| 4,233,067 A | 11/1980 | Sawada | 75/153 |
| 4,592,891 A | 6/1986 | Nishikawa et al. | 420/491 |
| 4,732,731 A | 3/1988 | Asai et al. | 420/473 |
| 4,750,029 A | 6/1988 | Futatsuka et al. | 357/67 |
| 4,908,275 A | 3/1990 | Tsuji et al. | 428/458 |
| 4,986,856 A | 1/1991 | Tanigawa et al. | 148/11.5 C |
| 5,130,274 A | 7/1992 | Harper et al. | 437/195 |
| 5,143,867 A | 9/1992 | d'Heurle et al. | 437/188 |
| 5,592,024 A * | 1/1997 | Aoyama et al. | 257/751 |
| 5,624,506 A | 4/1997 | Tsuzaki et al. | 148/433 |
| 5,674,787 A * | 10/1997 | Zhao et al. | 438/627 |
| 5,694,184 A | 12/1997 | Yamada et al. | 349/43 |
| 5,719,447 A | 2/1998 | Gardner | 257/762 |
| 5,789,320 A | 8/1998 | Andricacos et al. | 438/678 |
| 6,037,664 A * | 3/2000 | Zhao et al. | 257/758 |
| 6,060,892 A | 5/2000 | Yamagata | 324/754 |
| 6,066,892 A | 5/2000 | Ding et al. | 257/751 |
| 6,077,780 A | 6/2000 | Dubin | 438/687 |
| 6,147,402 A * | 11/2000 | Joshi et al. | 257/751 |
| 6,157,081 A | 12/2000 | Nariman et al. | 257/752 |
| 6,174,799 B1 | 1/2001 | Lopatin et al. | 438/627 |
| 6,181,012 B1 | 1/2001 | Edelstein et al. | 257/762 |

FOREIGN PATENT DOCUMENTS

| | | | |
|---|---|---|---|
| JP | 60110868 | 6/1985 | C23C/8/42 |
| JP | 62127438 | 6/1987 | C22C/9/00 |
| JP | 62133050 | 6/1987 | C22F/1/08 |
| JP | 1028337 | 1/1989 | C22C/9/06 |
| JP | 1056842 | 3/1989 | C22C/9/00 |
| JP | 2230756 | 9/1990 | H01L/21/80 |
| JP | 9157775 | 6/1997 | C22C/9/00 |
| JP | 10008167 | 1/1998 | C22C/9/04 |

* cited by examiner

*Primary Examiner*—Phat X. Cao
(74) *Attorney, Agent, or Firm*—Allen, Dyer, Doppelt, Milbrath & Gilchrist, P.A.

(57) ABSTRACT

For downwardly-scaled semiconductor processing, high-conductivity metal diffusion is blocked using extremely thin barrier films/layers. Diffusion of a highly-conductive metal is minimized using a dielectric barrier layer positioned a distance under the high-conductivity metal and a distance above the active regions of a semiconductor device. According to one embodiment, a semiconductor device also includes a highly-conductive metal interconnect patterned over a conductive partial diffusion barrier and adhesion promoting film. An underlying dielectric barrier layer against diffusion of the metal interconnect is formed above the active area but not in direct contact with the metal interconnect and is used to block diffusion that is not blocked by the partial diffusion barrier and adhesion promoting film. In a more specific embodiment, the metal interconnect is coated on the upper surface and edges with a thin electrolessly deposited partial barrier film, such as nickel or cobalt.

29 Claims, 2 Drawing Sheets

ARRANGEMENT AND METHOD FOR IMPROVED DOWNWARD SCALING OF HIGHER CONDUCTIVITY METAL-BASED INTERCONNECTS

RELATED PATENT DOCUMENTS

This is continuation-in-part of U.S. patent application Ser. No. 09/148,096, filed on Sep. 4, 1998, which is a continuation-in-part of U.S. patent application Ser. No. 09/045610, filed on Mar. 20, 1998, both of these patent documents being entitled "Metallic Structure Having Electromigration Resistance and Manufacturing Method Therefor." Priority to these applications is claimed for subject matter that is common, and each of these applications is incorporated herein in its entirety.

FIELD OF THE INVENTION

The present invention relates to the field of integrated circuits and integrated circuit manufacturing. More particularly, the present invention relates to the interconnection of electronic circuit structures and to blocking diffusion of high-conductivity structures using a thin barrier layer that is useable in downwardly scaled semiconductor structures.

BACKGROUND OF THE INVENTION

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices have been manufactured having various applications in numerous disciplines. Such silicon-based semiconductor devices often include metal-oxide-semiconductor (MOS) devices, such as p-channel MOS (PMOS), n-channel MOS (NMOS), complimentary MOS (CMOS), BiCMOS devices, and bipolar transistors. Each of these semiconductor devices generally includes a semiconductor substrate on which a number of active devices are formed and connected to other circuitry using metal interconnects extending from metal layers formed above the devices. The particular structure of a given active device can vary between device types. For example, a MOS transistor generally includes source and drain regions and a gate electrode that modulates current between the source and drain regions. Depending on the circuit design, one or more metal layers are formed above such MOS transistors with lower level metal interconnects extending to various portions of the MOS transistors, such as to the gate electrodes and the source/drain regions.

In the past, the metal interconnects have been typically formed from aluminum alloys. By the late 1 990s, other metals, including copper, have been increasingly used and considered because of their improved conductivity and improved resistance to electromigration.

One important step in the manufacture of such devices is the formation of barrier or isolation regions to prevent diffusion from the metal layers to the active areas of the semiconductor devices. Diffusion occurs at elevated temperatures where there is a concentration gradient between dopant atoms external to a region of the silicon wafer and dopant atoms in the silicon wafer region. Diffusion is problematic in a number of areas including, for example, in copper-based interconnect systems processed using technologies below about 0.25 μm and the "dual-Damascene" approach, where vias and metal lines are formed simultaneously into dielectric slots. To prevent copper diffusion into the active area of the device, various barrier metal or metal-compound films have been used including, for example, Ta and TaN at barrier thicknesses of about 300 Å to 500 Å. Preventing diffusion of copper is important, because the presence of copper in the substrate silicon causes an increase in pn junction leakage and threshold voltage shifts in MOS devices. Such diffusion has also caused reduced dielectric breakdown.

As downward scaling of semiconductor structures continues and processing approaches 0.06 μm (600 Å) levels, for example, conductive barrier films having thicknesses in the range of 300–500 Å will be prohibitively thick to the practical manufacture of such semiconductor structures. For example, a via having a width of 0.06 μm would be filled completely with a barrier film coating of only 300 Å in thickness. Further, because the resistivity of many barriers materials is quite high, a significant increase in sheet resistivity ("Rs") for copper lines, formed by the Damescene process, would occur with even thinner barriers. The resistivity of TaN, for example, is about 150 times higher than the resistivity of copper.

For such small via structures, in addition to the sidewall barrier thickness being a concern, the barrier material at the base of the opening would cause an increase in via resistance. For example, the resistance across the barrier in a 0.06 μm wide via using a 300 Å TaN bottom coating would be about 20 ohms.

While the above discussion evidences the need to reduce the barrier thickness for downwardly scaled semiconductor structures, an analysis of prior art suggests that the thickness of certain barrier materials against diffusion of the highly-conductive metals (such as copper and silver) can be reduced to thicknesses to about 100 Å without adversely impacting circuit operation. A more detailed analysis of published data on bias/temperature studies, on the effect of barrier thickness on dielectric failure (high leakage), suggests that for TaN barriers, a rough estimate for a minimum barrier thickness is on the order of 20 Å. This estimate is based on a number of assumptions that may or may not be applicable for a given application. Among others, these assumptions include: a median time to failure $t_{50}$ of about $10^6$ hours is needed at an operating temperature of 150° C., (consistent with a long term failure percent of 0.1 at $10^6$ hours and a log normal sigma of 0.8), and an acceleration factor to 275° C. (estimated on the basis of the activation energy of Cu diffusion in Cr). The temperature of 275° C. is the level at which there have been relevant studies of dielectric failure due to copper diffusion, with reported data on the median time to failure ($t_{50}$) for several thickness of TaN. For further information concerning such work, reference may be made to VMIC Conference Proceedings, June 10–12, 1997. p.87. The test device employed in this work was under an electric field of 2 MV/cm. This data can be plotted as $t_{50}$ versus the barrier thickness 'x' yielding the relationship:

$$t_{50}=kx,$$

where k=0.23 hours/Å.

Using the above target value of $t_{50}$ and the acceleration factor, a minimum barrier thickness for TaN is estimated to be on the order of 20 Å.

At the less aggressive operating temperature of 125° C., according to the present invention, an analysis based on the above reasoning suggests that a barrier on the order of a single monolayer would suffice. Thus, the very thin barrier films suggested in connection with the present invention would range from less than 60 Å to a monolayer of material depending, of course, on the diffusion coefficient (D) of the barrier.

The above estimate is for a sufficient barrier thickness to protect the dielectrically-insulated interconnects, where electric fields on the order of $2 \times 10^5$ V/cm might be present. The diffusion rate of copper is greatly accelerated by an electric field, but with a conductive barrier in place, the amount of copper transported into a dielectric is controlled by thermal diffusion rates only. But to protect underlying active devices and pn junctions, additional protection is necessary.

One prior art approach for forming copper-based interconnects or vias is illustrated in FIGS. 1A–1C. Beginning with FIG. 1A, the approach involves a plasma etching process to open a trench 110 through a SiN layer 112 and through an underlying $SiO_2$-based dielectric layer 114. The plasma etching process terminates when the trench 110 reaches a conductive contact region 116 under the $SiO_2$-based dielectric layer 114. As shown in FIG. 1B, a barrier layer 120 of sufficient thickness to protect underlying active transistors is then formed, followed by sputter deposition or electroplating of copper 122. A chemical-mechanical polishing (CMP) process is then used to planarize the structure down to the top of the SiN layer 112. The polished structure is shown in FIG. 1C. The SiN layer 112 acts as a hard polishing stop for the CMP process, and also inhibits copper diffusion into lower levels from the copper source and from any copper interconnects above the one shown in FIG. 1C.

One problem with this approach relates to the SiN layer 112 having a relatively high dielectric constant. The dielectric constant of the SiN layer 112 is about 7.5, whereas the dielectric constant of the $SiO_2$-based dielectric layer 114 is only about 3.9. This differential increases the capacitive coupling between interconnect levels that may be formed on the structure. This increased coupling adversely effects RC delays in the integrated circuit.

Accordingly, there has been a need for semiconductor structures, and manufacturing processes therefor, that are consistent with efforts to downward scale semiconductor structures while overcoming the above-discussed disadvantages.

SUMMARY OF THE INVENTION

According to various aspects of the present invention, embodiments thereof are exemplified in the form of manufacturing methods and structures involving diffusion barrier layers (or films) for highly-conductive metals such as copper and silver. One example implementation is directed to a process for fabricating a semiconductor device having an active area below a first level of metal interconnects. The process involves: forming a dielectric barrier against diffusion of a highly conductive metal, wherein the highly conductive metal in pure form is more conductive than aluminum; forming a refractory metal connecting device or plug that penetrates the dielectric barrier and makes electrical contact with a doped semiconductor material; forming a first level interconnect of the highly conductive metal, the highly conductive metal covered on the sides and on the bottom with a conductive barrier film that partially blocks (as compared to completely blocking) diffusion of the highly conductive metal at an operating temperature of the semiconductor device, wherein the dielectric diffusion barrier lies above the active area and lies below but not in direct contact with the first level of metal interconnects and blocks diffusion that is not blocked by the conductive barrier film.

Another example implementation of the present invention is directed to a method for fabricating a semiconductor device. The method includes: forming active devices on a semiconductor substrate and a first insulating film over the active devices; forming a dielectric barrier against penetration of copper over the first insulating film; forming a second insulating film over the dielectric barrier; forming an opening in the first and second insulating films and the dielectric barrier to doped semiconductor regions; filling the opening with a refractory metal; forming a third insulating layer over the refractory metal and the second insulating film; forming an opening to the refractory metal in the third insulating layer; and forming a thin barrier to copper diffusion within the opening; and filling the opening with copper.

Another example implementation of the present invention is directed to a semiconductor device involving a dielectric barrier for blocking diffusion of a highly conductive metal. The structure includes a dielectric barrier against diffusion of a highly conductive metal. The highly conductive metal in pure form is more conductive than aluminum, and the diffusion barrier lies above the active area and below but not in direct contact with the first level of metal interconnects. A refractory metal connecting device penetrates the dielectric barrier and makes electrical contact with a doped semiconductor material located on a side of the dielectric barrier opposite the first level of metal interconnects. The highly conductive metal is covered on the sides and on the bottom with a conductive barrier film, and the conductive barrier film is adapted so that it only partially blocks (as compared to completely blocking) diffusion of the highly conductive metal at an operating temperature of the semiconductor device.

Another embodiment of the present invention is also directed to a semiconductor device, but with the semiconductor device constructed with: a dielectric barrier layer; a thin, conductive, partial-diffusion barrier and adhesion promoting film; and a highly-conductive-metal interconnect patterned over the thin, conductive, partial-diffusion barrier and adhesion promoting film. Further, a thin barrier film is arranged to coat the metal interconnect on its upper surface and edges, and the metal interconnect overlies but is not in direct contact with the dielectric barrier layer. In a more specific embodiment, the highly-conductive-metal interconnect is copper or a copper alloy.

Another embodiment of the present invention is directed to a method for fabricating a semiconductor device having active devices. This method comprises: covering a highly-conductive metal-based connecting means on the edges and lower surface with a conducting barrier and adhesion improvement film, the conducting barrier and adhesion improvement film selected to partially block the high conductivity metal diffusion at the operating temperature of the semiconductor device; and forming on the semiconductor substrate an insulating barrier film to the highly-conductive metal-based connecting means, the insulating barrier film laying between the metal based connecting means and the active devices, wherein the insulating barrier film is not in direct contact with the active devices and the highly-conductive metal-based connecting means.

The above summary is not intended to provide an overview of all aspects of the present invention. Other aspects of the present invention are exemplified and described in connection with the detailed description.

BRIEF DESCRIPTION OF THE DRAWINGS

Various aspects and advantages of the present invention will become apparent upon reading the following detailed description of various embodiments and upon reference to the drawings in which.

Figure 1A:
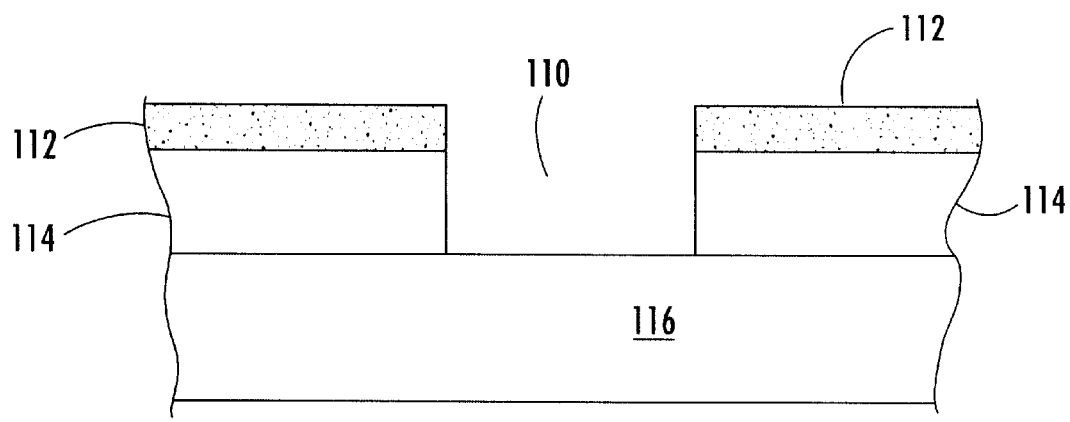
FIGS. 1A, 1B and 1C are cross-sectional views of a semiconductor structure at various stages of implementation, according to the prior art.
Figure 1B:
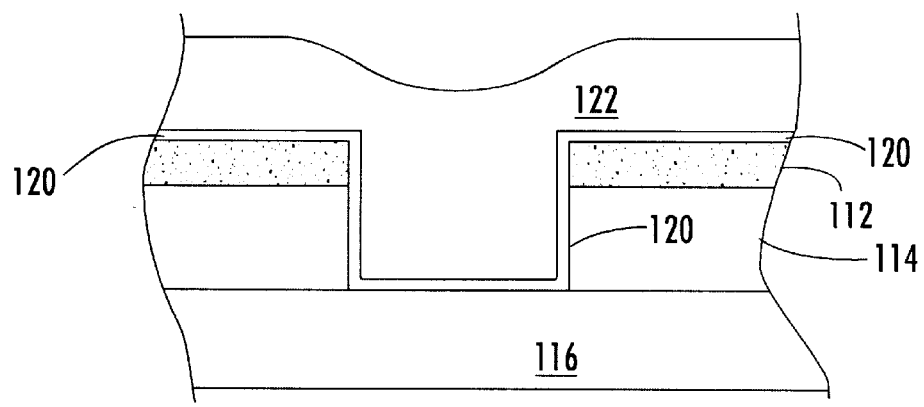
Figure 1C:
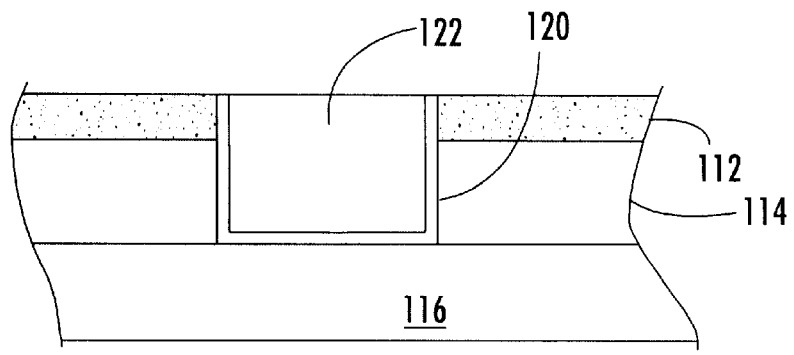

While the invention is amenable to various modifications and alternative forms, specifics thereof have been shown by way of example in the drawings and will be described in detail. It should be understood, however, that the intention is not to limit the invention to any particular embodiment described. On the contrary, the invention is to cover all modifications, equivalents, and alternatives falling within the spirit and scope of the invention as defined by the appended claims.

DETAILED DESCRIPTION

The present invention may be applied to a variety of semiconductor structures and process technologies, and has been found to be particularly advantageous for use in connection with semiconductor structures that have been downwardly scaled using a process technology that does not permit for conventionally constructed diffusion barrier layers for highly-conductive metals. While the present invention is not necessarily so limited, an appreciation of various aspects of the invention may be obtained through a discussion of various examples in such applications.

Figure 2:
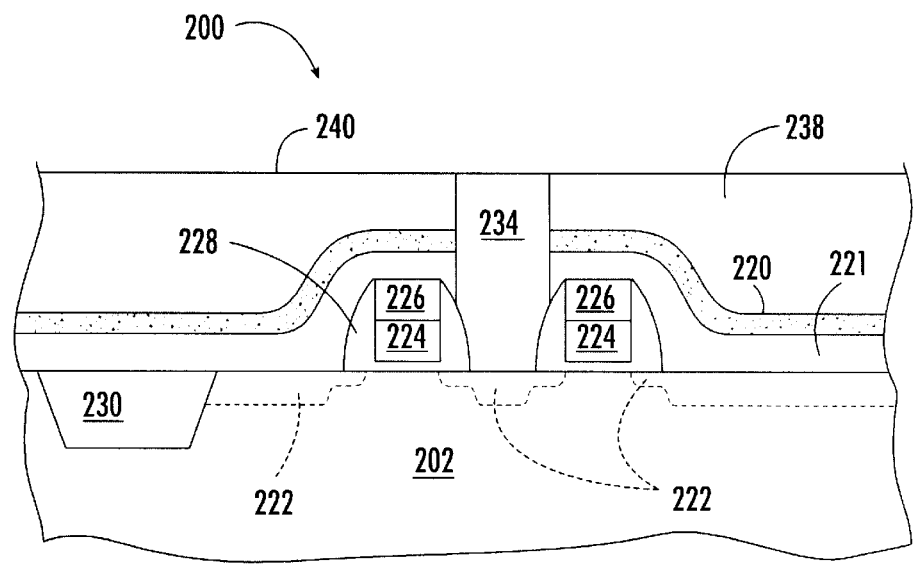
FIG. 2 is a cross-sectional view of a semiconductor structure, according to an example embodiment of the present invention.

Turning now to the drawings, FIG. 2 illustrates a semiconductor structure 200, constructed in accordance with an aspect of the present invention. The semiconductor structure 200 has a dielectric diffusion barrier layer 220 arranged over conventional circuitry to block against diffusion from overlaying highly-conductive metal layers (not shown). The circuitry includes diffused source/drain (S/D) regions 222, polysilicon gate electrodes 224 with cap dielectric regions 226, and dielectric sidewalls 228 exemplified as $SiO_2$ or SiN spacers 228. The semiconductor structure 200 further includes shallow trench isolation regions 230 and a conventional self-aligned tungsten (or other refractory metal) plug 234 that connects directly to one of the S/D regions 222.

According to another aspect of the present invention, the semiconductor structure 200 is manufactured using steps that employ conventional technology. According to one example process that is consistent with the present invention, the structure 200 of FIG. 2 is fabricated by first providing a silicon substrate 202 as the underlying structure for circuitry development, followed by forming shallow trench isolation regions 230, as is conventional. The silicon substrate 202 is then covered with a gate dielectric such as a $SiO_2$ or SiON material. The polysilicon gate electrodes 224 and cap dielectric regions 226 are formed using conventional photomasking and etching processes, and a conventional doping technique is used to dope the gate material as the application may require.

A photoresist pattern is then applied. The stack of films are plasma etched, and the photoresist is removed, for example, using a conventional oxygen plasma method. The lightly doped regions are then formed using conventional ion implantation.

Insulative dielectric sidewalls 228 are then formed. In one implementation, the sidewalls 228 are formed by depositing a conformal $SiO_2$ or SiN layer; the dielectric is then anisotropically etched back to form the illustrated vertically-arranged sidewall spacers 228. The more heavily doped source and drain regions 222 are formed using an n or p ion implant process with appropriate masking, as is conventional. A rapid thermal anneal (RTA) process is used to activate the implanted regions.

A conformal oxide film is deposited to form a dielectric film 221. The dielectric film 221 may be, for example, undoped $SiO_2$, and may be deposited using various conventional methods such as chemical vapor deposition ("CVD") or high-density plasma CVD (sometimes referred to as "HDPCVD"). Next, a thin SiN film is deposited over conformal oxide film 221 to form the diffusion barrier layer 220, and another deposition of conformal oxide film is used to form an upper dielectric film 238. Dielectric film 238 is then planarized, for example, using a CMP method.

To form the tungsten plug 234, the structure including the upper dielectric film 221 is first via-etched (e.g., using an anisotropic mask/etching process) to form a vertical or slightly sloped aperture that defines the shape of the plug. A thin layer of conductive barrier and adhesion-promoting liner film, such as Ti/TiN, may be deposited into the aperture using a conventional deposition process, such as sputtering or CVD. The aperture is then filled with CVD tungsten. The illustrated structure 200 is then planarized back to surface 240, for example, using a CMP process.

Figure 3:
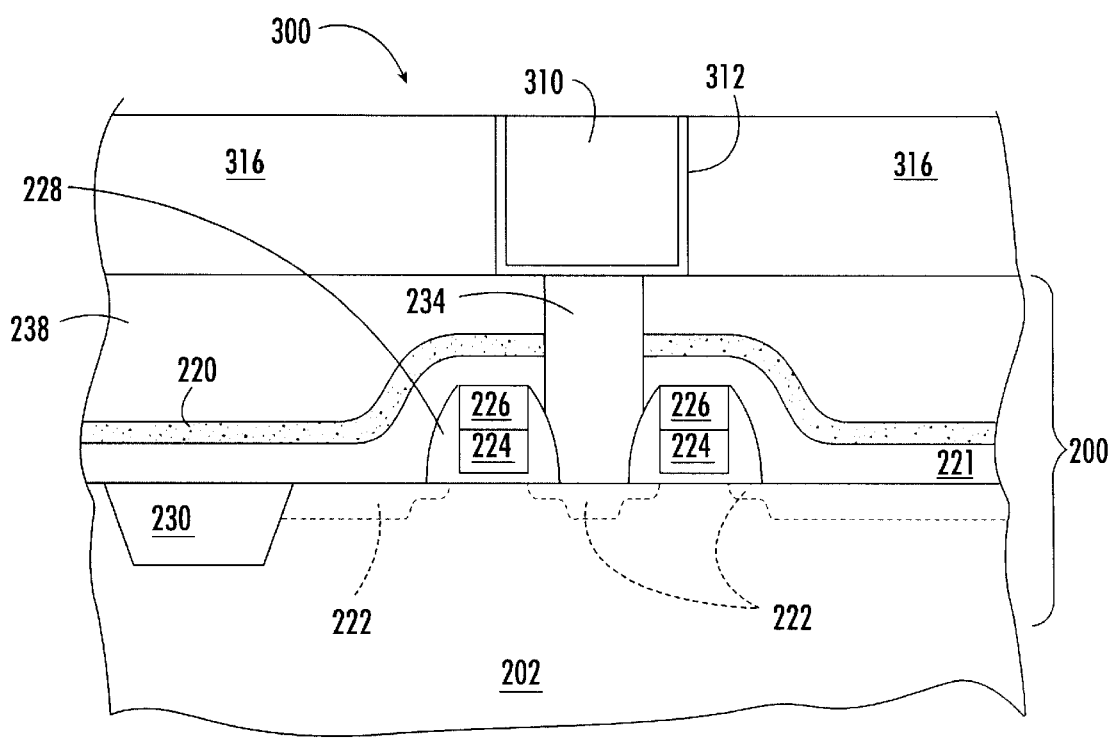
FIG. 3 is a cross-sectional view of another semiconductor structure, also according to an example embodiment of the present invention.

In accordance with another embodiment of the present invention, FIG. 3 shows a structure 300 having a copper interconnect 310 formed over the structure 200 of FIG. 2, and a thin adhesion-promoting partial-barrier film 312 underlying the copper interconnect 310. In one example process for building the structure 300 and in accordance with the present invention, after forming the tungsten plug 234, an insulating layer 316 is deposited, and then an opening is made through the insulating layer 316 to permit access to the top surface of the tungsten plug 234. Next, the barrier film 312 is deposited to cover the bottom and sidewalls of the opening. Copper is then deposited to form the copper interconnect 310. Even though some limited amount of diffused copper may penetrate the thin adhesion/partial barrier film 312, the copper cannot get past the thick tungsten plug 234 and the diffusion barrier layer 220. The copper interconnect 310 enjoys a relatively low $R_s$, that gives rise to reduced RC interconnect delays and enables high-performance circuit operation.

The contact resistance of copper layer 310 to tungsten plug 234 is very low because of the very thin barrier layer 312.

According to another embodiment, in addition to the copper interconnect 310, upper level copper-based interconnects are constructed using a similar thin adhesion/partial barrier film such as the film 312.

In each of these embodiments, such partial barrier films employ the term "partial" because they block some but not all of the diffusion of highly conductive metal. As explained above, the thin conductive barrier should block sufficient Cu at the operating temperature of the device that, even though the dielectric has become contaminated with copper, reliability objectives are met. This level of copper contamination is higher than that tolerated by active transistors and pn junctions.

The required thickness of the barrier is a function of the diffusion coefficient of the material. In order to give more quantitative visibility to this property, the table below is given for selected materials and their diffusion coefficients at 800° C. The approximate minimum thickness for a barrier as used in example embodiments of the present invention is then listed relative to TaN, which has been estimated to be 20 Å at an operating temperature of 150° C. The example data is only approximate, of course, since diffusion coefficients are a function of various properties such as the deposition method, grain size and orientation, degree of grain boundary stuffing, annealing treatments, alloying elements, and other factors.

| MATERIAL | APPROX. DIFFUSION COEFFICIENT AT 800° C. | THICKNESS USED AT 150° C. OPERATING |
|---|---|---|
| $SiO_2$ | $4 \times 10^{-5}$ cm$^2$/sec | 200 μm |
| Cd | $5 \times 10^{-10}$ cm$^2$/sec | 8000 Å |
| Cr | $10^{-11}$ cm$^2$/sec | 1200 Å |
| TaN or WN | $3 \times 10^{-15}$ cm$^2$/sec | 20 Å |
| $Si_3N_4$ | $10^{-16}$ cm$^2$/sec | 20 Å or less |

To make a viable barrier for 0.06 μm technology, for example, the barrier thickness should be about 60 Å or less. However, even a barrier thickness of about 60 Å would plug about 20% of a 600 Å wide aperture. Accordingly, for certain applications, viable barrier material should have a diffusion coefficient on the order of $10^{-14}$ cm$^2$/sec or less at 800° C. This data is applicable when it is reasonable to assume that the diffusion length $\sqrt{Dt}$ is proportionate to the effectiveness of the barrier. The skilled artisan will appreciate that the temperature of 800° C. is merely an example temperature, exemplifying and corresponding to several values of D relating to relevant technical literature.

An important advantage of the above-described embodiments is that the associated manufacturing methodology significantly increases the ability to scale down the semiconductor structures while effectively using barrier materials. For example, as the semiconductor industry moves from recently-developed 0.18 μm technology to 0.06 μm technology, for example, minimum features are expected to shrink by a factor of three. The above-exemplified aspects of the present invention allow for downward scaling of the barrier films by a factor of ten or more.

Alternative constructions, also consistent with the present invention, can be constructed. For example, because many of the barrier films used for copper and silver are common, a silver-based system is constructed in the same manner as described above, but with the copper interconnect 310 being replaced by silver. Similarly, a gold-based system is constructed as described above, but with the copper interconnect 310 being replaced by gold and using barrier films of Ti:W, W or Mo or their nitrides, for example.

According to yet other aspects of the present invention, each of the copper-based, silver-based and gold-based embodiments described above are improved in their resistance to electromigration by the addition of selected dopants as described in the above-referenced ancestor patent documents.

Referring again to FIG. 3, in an alternate embodiment the illustrated copper interconnect 310 is coupled to a diffusion barrier (not shown). In one example embodiment, a thin SiN coating is applied over the planarized upper surface of the copper interconnect 310. In a more specific embodiment, the thickness of the coating is sufficiently thin (e.g., 20–200 Å) that the additional capacitive coupling is not a serious concern. The effectiveness of such a coating is discussed by D. Yost, in "Semiconductor Equipment Industry Migration from Equipment to Entire Module Process Solutions," IEEE 1998 Integrated Reliability Workshop, Stanford Sierra Camp, Lake Tahoe, Calif., October 1998.

In another embodiment that slightly modifies the structure of FIG. 3, the upper surface of the copper interconnect 310 is polished using CMP beyond the norm so as to create a depressed copper region at its upper surface. This polishing process is followed with a Ti:W(N) coating. A subsequent CMP process creates a Ti:W(N) barrier cap (not shown). For further information concerning such over-polishing, reference may be made to T. Mori, et al., "Metal Capped Cu Interconnection Technology by Chemical Mechanical Polishing," 1996 VMIC Conf, Jun. 18–20, 1996, pg.487.

In yet another embodiment, a barrier or partial barrier (such as a CoWP alloy) is electrolessly deposited on the exposed upper surface of the copper interconnect 310. For further information concerning such deposition, reference may be made to Sergey Lopatin, et al., "Electroless Cu and Barrier Layers for Sub-Micron Multilevel Interconnects," Proceedings of SPIE, Multilevel Interconnect Technology, 3214, October, 1997, pg. 21.

In other alternate embodiments, a partial diffusion barrier is used to seal the upper surface of the copper interconnect 310 of FIG. 3 with an electroless cobalt system and, in a separate embodiment, with a nickel-based system. Referring first to the electroless cobalt system, the binary phase diagram of Co and Cu evidence no intermetallic compounds and limited solubilities in the pure metals. At 400° C., the solubility of Co in Cu is less than 0.05 weight percent while the solubility of Cu in Co is about ten percent. But the diffusion of Cu through Co is slow with a bulk diffusion activation energy of 2.85 eV and a pre-exponential factor of 1.0. The diffusion distance in one hour at 400° C. is theoretically less than one monolayer. Some Cu diffuses through a thin film Co barrier at such temperatures by grain boundary processes, but nevertheless, the metal provides a good barrier in that direction.

Nickel is not a barrier for Cu in the usual sense because Cu and Ni form a continuous series of solid solutions and are therefore mutually soluble in all proportions. However, the diffusion activation energies (the $E_a$ values) are high. For example, for Cu into Ni, the $E_a$ value is 2.7 eV, and for Ni into Cu, the $E_a$ value is about 2.3 eV. A Ni barrier can also successfully serve by limiting back-end wafer processing temperatures. Cobalt, however, is a better barrier to Cu than Ni. In this regard, reference may be made, for example, to: Milan Paunovic, et al., "Electrochemically Deposited Diffusion Barriers," J. Electrochem. Soc., 141, No. 7, July 1994, pg. 1843.

For further information concerning both cobalt and nickel electroless deposit processes, generally and for filling vias, reference may be made to: the above-mentioned article by Milan Paunovic; C. H. Ting, et al., "Selective Electroless Metal Deposition for Hole Filling in VLSI Multilevel Interconnection Structures," Proceedings of the Symposium on Electroless Deposition of Metals and Alloys, The Electrochemical Society, Inc., Electrodeposition Division, vol. 88-12, 1988; Glenn O. Mallory, et al., "Electroless Plating: Fundamentals and Applications," AESF, Orlando, Fla., 1990; and Pei-Lin Pai & Chiu H. Ting, "Copper as the Future Interconnection Material," VMIC Conference, pp. 258–263, Jun. 12–13, 1989.

For this application, depending on how far the technology has been scaled and depending on the heat treatments in the interconnect processing, about 100 to 300 Å of Ni, Co, or Ni+Co alloy is adequate in providing a barrier that prevents the escape of a significant amount of copper into the surrounding dielectric from the top surface of the metal. Stuffing with co-deposited boron or phosphorus will improve such barriers. The barriers could also be ion implanted with nitrogen to lower the diffusion rate of copper through them. The coated metal will also exhibit improved oxidation and corrosion resistance.

Various barriers for copper diffusion can be implemented by electrochemically depositing various combinations of films of Ni, Co and Ni+Co alloys, with some films contained varying amounts of boron or phosphorus. According to a report in Milan Paunovic, et al., "Electrochemically Deposited Diffusion Barriers," J. Electrochem. Soc., 141, No. 7, July 1994, pg. 1843, a good barrier is provided using a twenty-two percent to sixty-eight percent electroless Ni+Co (P) film having a thickness of 1000 Å. In this regard, such a film can block copper penetration at 400° C. for 14 hours.

Silver and nickel, or silver and cobalt, are almost mutually insoluble and exhibit no compound formation. Both types of metal are therefore excellent diffusion barriers against silver.

The diffusion rate of silver in silicon is more than $10^5$ times slower than that of copper. For this reason, there is little concern regarding contamination of the semiconductor substrate. Silver, however, has a high rate of diffusion in silicon dioxide. Accordingly, in an alternative embodiment of the present invention, a thin coating of electroless cobalt or nickel (or Ni+Co alloy) is deposited on the sides and upper surfaces of silver patterned by subtractive etching, using ion milling, for example. This provides a barrier to movement of silver into the surrounding dielectric insulation, and also provides increased resistance to corrosion, oxidation, and staining for this highly-conductive metal. Dopants for improving the electromigration resistance of silver, and combination diffusion-barrier/adhesion-layers for the metal are discussed in connection with the parent patent documents. Silver and silver alloys may be deposited, for example, by conventional electroplating, sputtering, or evaporation.

A silver-based system may also be created using the Damescene approach, and with the upper surface passivated against corrosion and diffusion by an electroless Ni or Co-based system, as discussed above.

An alternative embodiment for a copper-based interconnect is to pattern the metal by subtractive etching, as opposed to the Damascene-based process discussed above. For example, as was the case in the fabrication prior art bubble memories, copper or silver may be patterned with photoresist and ion milling, an ion beam bombardment technique. After formation of the silicon nitride lower level barrier, a very thin conductive barrier film such as Ti/TaN (or one of its known alternatives) is deposited followed by a coating of copper. The two layers are then patterned using photoresist and ion milling, or using a hard mask and chlorine-based plasma chemistry at high temperature, as is conventional. The patterned lines are then coated using PECVD methods, for example, with a thin silicon nitride film that is approximately the same thickness as the underlying, conductive, partial barrier and adhesion promoting film discussed above. As an option, the subtractively-etched copper lines may be coated with a thin layer of SiN. The copper lines are then insulated for the next level of interconnects, as is conventional. The copper may be doped as discussed above so that the electromigration resistance is significantly improved. For further information regarding the above process, reference may be made to an article by Shearer and Quadri, entitled "Reliability Analysis of Several Conductors at High Current Densities for Use in Bubble Memories," published in 1980, and for further information concerning coating the subtractively-etched copper lines with SiN, reference may be made to an article by Donald S. Gardner et al., entitled "Encapsulated Copper Interconnection Devices Using Sidewall Barriers," Thin Solid Films, 262, 1995, pg. 104.

The thickness of the barrier(s) for a given application is selected based on various processing factors. For example, at an operating temperature of 125° C., which is less aggressive than that used in the reports referred to the background section of this patent document, an analysis based on the same reasoning suggests that a barrier on the order of a single monolayer would suffice. Thus, according to one embodiment of the present invention, thin barrier films implemented according to the present invention range from less than 60 Å to a monolayer of material. Dropping the barrier film thickness from 100 Å to 20 Å, for example, yields a reduction in the $R_s$, value to about 0.21 ohms/square, which is a twenty-eight percent improvement. A value of 20 Å still provides good adhesion and a substrate for the copper plating seed layer, assuming use of that copper deposition process. But such a barrier does not completely block all copper diffusion into the surrounding dielectric.

The presence of a low concentration of copper in the dielectrics used to separate and insulate the metal interconnects is not a problem if the copper can be prevented from reaching the active device area. As described herein, copper is prevented from reaching the active device area by careful placement of the barrier layer 220, such as $Si_3N_4$ (because the stoichiometric values may vary, sometimes referred to as "SiN").

Consistent with the above-described embodiments, other example film dimensions include: polysilicon gate electrode 224 and cap dielectric region 226 having thicknesses in a range of about 500 Å to 2500 Å; the thickness of the barrier layer 220 over the source/drain regions 222 being in a range of about 10 Å to 200 Å, and over the cap dielectric being in a range of about 200 Å to 1000 Å; and the distance of the barrier layer 312 under the copper interconnect 310 being in a range of about 5 Å to 70Å.

It will be understood each of the above-mentioned background references is incorporated herein by reference in its entirety, and that the various barrier materials mentioned in these references may be employed in alternative implementations to the above-discussed embodiments, unless emphasis is directed to a specific type of material due to its properties. For example, certain of the mentioned barrier layers do not promote adhesion and therefore are not interchangeable with a barrier layer or film that promotes adhesion. The advantages of using multiple forms of barrier materials as may be exemplified by combining different ones of the above-discussed embodiments will also be appreciated by the skilled artisan.

The various embodiments described above are provided by way of illustration only and are not intended to limit the invention. Those skilled in the art will readily recognize various modifications and changes that may be made to the present invention without strictly following the example embodiments and applications illustrated and described herein. The scope of the present invention is set forth in the following claims.

What is claimed is:

1. A semiconductor device comprising:

a substrate;

at least one active region formed in said substrate;

a first dielectric layer over said at least one active region;

a dielectric diffusion barrier layer over said first dielectric layer;

a second dielectric layer over said dielectric diffusion barrier layer;

a metal interconnect over said second dielectric layer; and a conductive partial-diffusion barrier and adhesion-promoting layer between said metal interconnect and adjacent portions of said second dielectric layer;

said conductive partial-diffusion barrier and adhesion-promoting layer being relatively thin and being spaced from said dielectric diffusion barrier layer by said second dielectric layer.

2. A semiconductor device according to claim 1 wherein said metal interconnect comprises at least one of copper and alloys thereof.

3. A semiconductor device according to claim 1 wherein said metal interconnect comprises at least one of silver and alloys thereof.

4. A semiconductor device according to claim 1 further comprising another dielectric diffusion barrier layer over upper portions of said metal interconnect.

5. A semiconductor device according to claim 1 further comprising another conductive diffusion barrier layer over upper portions of said metal interconnect.

6. A semiconductor device according to claim 1 wherein said conductive partial-diffusion barrier and adhesion-promoting layer has a thickness less than about 20Å.

7. A semiconductor device according to claim 1 wherein said first and second dielectric layers each comprises silicon dioxide.

8. A semiconductor device according to claim 1 wherein said dielectric diffusion barrier comprises silicon nitride.

9. A semiconductor device according to claim 1 further comprising a conductive plug connecting a lower portion of said metal interconnect to said at least one active region.

10. A semiconductor device according to claim 1 wherein said second dielectric layer has a higher contamination of metal from said metal interconnect than said first dielectric layer.

11. A semiconductor device according to claim 1 wherein said first and second dielectric layers each have a lower dielectric constant than said dielectric diffusion barrier layer.

12. A semiconductor device according to claim 1 wherein said conductive partial-diffusion barrier and adhesion-promoting layer comprises at least one of titanium and titanium nitride.

13. A semiconductor device comprising:

a substrate;

at least one active region formed in said substrate;

a first dielectric layer over said at least one active region;

a dielectric diffusion barrier layer over said first dielectric layer, said dielectric diffusion barrier comprising silicon nitride;

a second dielectric layer over said dielectric diffusion barrier layer;

a metal interconnect over said second dielectric layer, said metal interconnect comprising at least one of copper and alloys thereof;

a conductive partial-diffusion barrier and adhesion-promoting layer between said metal interconnect and adjacent portions of said second dielectric layer;

said conductive partial-diffusion barrier and adhesion-promoting layer being relatively thin and being spaced from said dielectric diffusion barrier layer by said second dielectric layer; and another diffusion barrier over upper portions of said metal interconnect.

14. A semiconductor device according to claim 13 wherein said conductive partial-diffusion barrier and adhesion-promoting layer has a thickness less than about 20Å.

15. A semiconductor device according to claim 13 wherein said first and second dielectric layers each comprises silicon dioxide.

16. A semiconductor device according to claim 13 further comprising a conductive plug connecting a lower portion of said metal interconnect to said at-least one active region.

17. A semiconductor device according to claim 13 wherein said second dielectric layer has a higher contamination of metal from said metal interconnect than said first dielectric layer.

18. A semiconductor device according to claim 13 wherein said first and second dielectric layers each have a lower dielectric constant than silicon nitride.

19. A semiconductor device comprising:

a substrate;

at least one active region formed in said substrate;

a dielectric diffusion barrier layer over said at least one active region;

a dielectric layer over said dielectric diffusion barrier layer;

a metal interconnect over said dielectric layer; and a conductive partial-diffusion barrier and adhesion-promoting layer between said metal interconnect and adjacent portions of said dielectric layer;

said conductive partial-diffusion barrier and adhesion-promoting layer being relatively thin and being spaced from said dielectric diffusion barrier layer by said dielectric layer.

20. A semiconductor device according to claim 19 wherein said metal interconnect comprises at least one of copper and alloys thereof.

21. A semiconductor device according to claim 19 wherein said metal interconnect comprises at least one of silver and alloys thereof.

22. A semiconductor device according to claim 19 further comprising another dielectric diffusion barrier layer over upper portions of said metal interconnect.

23. A semiconductor device according to claim 19 further comprising another conductive diffusion barrier layer over upper portions of said metal interconnect.

24. A semiconductor device according to claim 19 wherein said conductive partial-diffusion barrier and adhesion-promoting layer has a thickness less than about 20Å.

25. A semiconductor device according to claim 19 wherein said dielectric layer comprises silicon dioxide.

26. A semiconductor device according to claim 19 wherein said dielectric diffusion barrier comprises silicon nitride.

27. A semiconductor device according to claim 19 further comprising a conductive plug connecting a lower portion of said metal interconnect to said at least one active region.

28. A semiconductor device according to claim 19 wherein said dielectric layer has a lower dielectric constant than said dielectric diffusion barrier layer.

29. A semiconductor device according to claim 19 wherein said conductive partial-diffusion barrier and adhesion-promoting layer comprises at least one of titanium and titanium nitride.

* * * * *